United States Patent
Sakamuri et al.

(10) Patent No.: US 11,721,543 B2
(45) Date of Patent: Aug. 8, 2023

(54) PLANARIZING PROCESS AND COMPOSITION

(71) Applicant: Fujifilm Electronic Materials U.S.A., Inc., N. Kingstown, RI (US)

(72) Inventors: Raj Sakamuri, Sharon, MA (US); Ognian Dimov, Warwick, RI (US); Sanjay Malik, Attleboro, MA (US); Michaela Connell, Cumberland, RI (US); Ahmad A. Naiini, East Greenwich, RI (US); Stephanie Dilocker, Attleboro, MA (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 294 days.

(21) Appl. No.: 17/060,445

(22) Filed: Oct. 1, 2020

(65) Prior Publication Data
US 2021/0104398 A1   Apr. 8, 2021

Related U.S. Application Data

(60) Provisional application No. 62/910,766, filed on Oct. 4, 2019.

(51) Int. Cl.
*H01L 21/02* (2006.01)
*C08L 79/08* (2006.01)
(Continued)

(52) U.S. Cl.
CPC ........ *H01L 21/02109* (2013.01); *C08L 79/08* (2013.01); *H01L 23/293* (2013.01);
(Continued)

(58) Field of Classification Search
None
See application file for complete search history.

(56) References Cited

U.S. PATENT DOCUMENTS

| 2,731,447 A | 1/1956 | Gresham et al. |
| 3,435,002 A | 3/1969 | Holub |

(Continued)

FOREIGN PATENT DOCUMENTS

| JP | 61-226745 | 10/1986 |
| JP | 61-226746 | 10/1986 |

(Continued)

OTHER PUBLICATIONS

International Search Report and Written Opinion of the International Searching Authority for International Application No. PCT/US2020/053722, dated Dec. 30, 2020.
(Continued)

*Primary Examiner* — Benjamin P Sandvik
(74) *Attorney, Agent, or Firm* — Fish & Richardson P.C.

(57) ABSTRACT

This disclosure describes a process of generating a planarizing polyimide based dielectric film on a substrate with conducting metal pattern, wherein the process comprised steps of: (a) providing a dielectric film forming composition comprising at least one fully imidized polyimide polymer and at least one solvent; and (b) depositing the dielectric film forming composition onto a substrate with conducting metal pattern to form a dielectric film, wherein the difference in the highest and lowest points on a top surface of the dielectric film is less than about 2 microns.

14 Claims, 1 Drawing Sheet

(51) Int. Cl.
*H01L 33/54* (2010.01)
*H01L 31/048* (2014.01)
*H01L 23/29* (2006.01)

(52) U.S. Cl.
CPC .......... *H01L 31/0481* (2013.01); *H01L 33/54* (2013.01); *C08L 2203/16* (2013.01)

(56) References Cited

U.S. PATENT DOCUMENTS

| | | | |
|---|---|---|---|
| 3,856,752 | A | 12/1974 | Bateman et al. |
| 3,983,092 | A | 9/1976 | Bateman et al. |
| 4,026,876 | A | 5/1977 | Bateman et al. |
| 4,040,831 | A | 8/1977 | Rubner et al. |
| 4,579,809 | A | 4/1986 | Irving |
| 4,608,409 | A | 8/1986 | Coady et al. |
| 4,629,777 | A | 12/1986 | Pfeifer |
| 4,656,116 | A | 4/1987 | Rohde et al. |
| 4,960,860 | A | 10/1990 | Saito et al. |
| 4,985,529 | A | 1/1991 | Saito et al. |
| 5,006,611 | A | 4/1991 | Schmid et al. |
| 5,081,005 | A * | 1/1992 | Chakravorty ..... H01L 21/76879 430/311 |
| 5,122,436 | A | 6/1992 | Tunney et al. |
| 5,248,760 | A * | 9/1993 | DuBois .............. C08G 73/1028 528/229 |
| 5,252,534 | A | 10/1993 | Depalma et al. |
| 5,478,915 | A | 12/1995 | Amone et al. |
| 5,712,506 | A * | 1/1998 | Shimoto ................ H01L 23/293 257/632 |
| 5,773,559 | A | 6/1998 | Miyamoto et al. |
| 5,783,656 | A | 7/1998 | Kimura et al. |
| 5,969,055 | A | 10/1999 | Nishikawa et al. |
| 6,803,327 | B1 | 10/2004 | Cheu et al. |
| 6,844,950 | B2 | 1/2005 | Chisholm et al. |
| 9,617,386 | B2 | 4/2017 | Reinerth et al. |
| 2004/0235992 | A1 | 11/2004 | Okada et al. |
| 2004/0265731 | A1 | 12/2004 | Okada et al. |
| 2005/0040431 | A1* | 2/2005 | Iwabuchi ............ H01L 29/1008 257/E29.026 |
| 2007/0083016 | A1 | 4/2007 | Dueber et al. |
| 2008/0260956 | A1* | 10/2008 | Sakurai ............ H01L 21/02216 528/21 |
| 2011/0049731 | A1 | 3/2011 | Dershem et al. |
| 2015/0198890 | A1* | 7/2015 | Hubbard .................. G03F 7/38 430/325 |
| 2016/0177018 | A1* | 6/2016 | Soucek ...................... C08J 5/18 522/138 |
| 2016/0208097 | A1* | 7/2016 | Bu .......................... C08L 79/08 |
| 2016/0313641 | A1 | 10/2016 | De et al. |
| 2016/0313642 | A1* | 10/2016 | Malik .................. H01L 21/311 |
| 2018/0215874 | A1* | 8/2018 | Kawabata ................ G03F 7/20 |
| 2019/0077913 | A1 | 3/2019 | Malik et al. |
| 2020/0333709 | A1* | 10/2020 | Kori ...................... C07C 233/80 |

FOREIGN PATENT DOCUMENTS

| | | |
|---|---|---|
| JP | 62-170950 | 7/1987 |
| JP | H9-54432 | 2/1995 |
| JP | H7-230165 | 8/1995 |
| JP | H8-62834 | 3/1996 |
| JP | H9-5988 | 1/1997 |
| JP | 62-36663 | 11/2017 |
| JP | 63-34540 | 5/2018 |

OTHER PUBLICATIONS

Kim et al., "Corrosion protection and adhesion promotion for polyimide/copper system using silane-modified polymeric materials", Polymer, vol. 41, pp. 6553-6561 (Apr. 27, 2000).
Extended European Search Report in European Appln No. 20872978.0, dated Nov. 2, 2022, 7 pages.
Liu et al., "Synthesis and properties of soluble fluorinated poly(ether imide)s with different pendant groups," Polymer, Nov. 24, 2008, 49(25): 5439-5445.

* cited by examiner

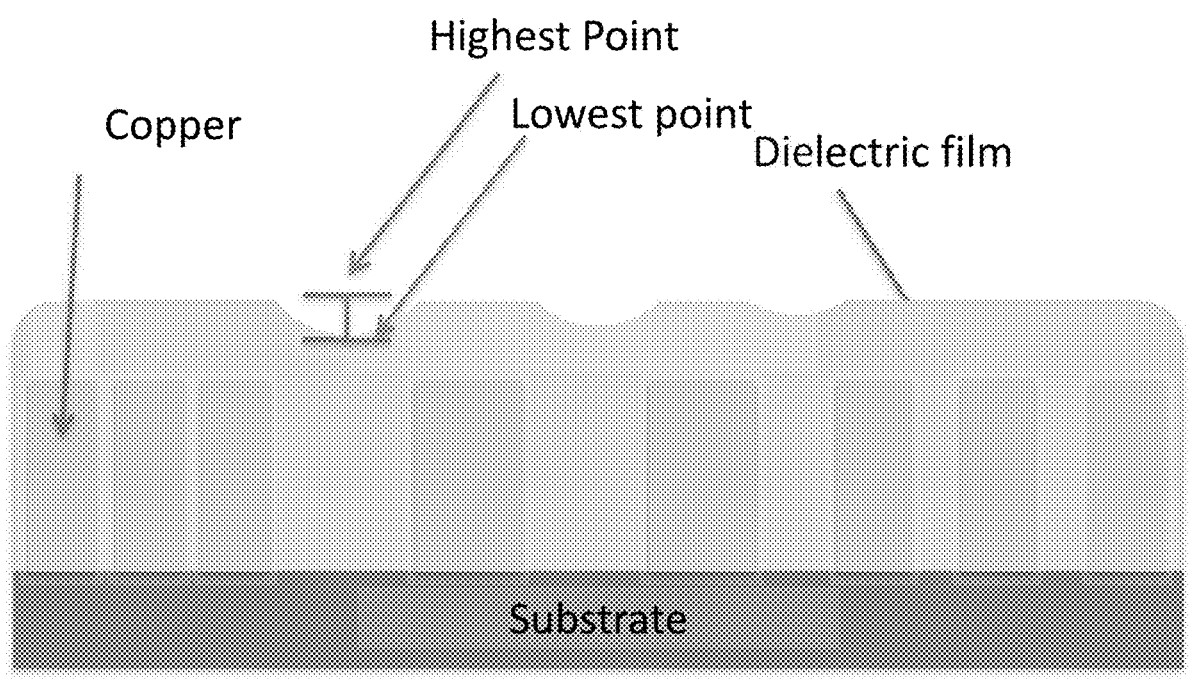

PLANARIZING PROCESS AND COMPOSITION

CROSS-REFERENCE TO RELATED APPLICATION

The present application claims priority to U.S. Provisional Application Ser. No. 62/910,766, filed on Oct. 4, 2019, the contents of which are hereby incorporated by reference in their entirety.

BACKGROUND OF THE DISCLOSURE

Architecture for packaging substrates becomes more and more complex. In a multilayer structure one can expect a wide range of density of conducting metal wires (e.g., copper wires). Therefore, it is important that dielectric film forming composition effectively planarizes complex topography across multiple densities of conducting metal wiring.

In multi-stack build-up of circuitry, several steps of conducting metal deposition and patterning are employed. In the absence of good planarization of underlying topography, dielectric layer may not sufficiently cover conducting metal wires, resulting in electrical failures.

Although current polyimide based film forming compositions have excellent insulating properties, they lack good planarization properties due to high rigidity and solution/melt viscosity.

SUMMARY OF THE DISCLOSURE

An objective of this invention is to provide a process of using a novel film forming polyimide based composition to form a dielectric film with good planarization properties. In some embodiments, the difference between the highest and lowest points of the top surface of a dielectric film described herein can be less than about 2 microns (FIG. 1).

In some embodiments, this disclosure features a process of generating a planarizing polyimide based dielectric film on a substrate with conducting metal (e.g., copper) pattern, wherein the process comprised steps of:
  a. providing a dielectric film forming composition comprising at least one fully imidized polyimide polymer and at least one solvent; and
  b. depositing the dielectric film forming composition onto a substrate with conducting metal pattern to form a dielectric film, wherein the difference in the highest and lowest points on a top surface of the dielectric film is less than about 2 microns.

In some embodiments, this disclosure features a three dimensional object prepared by the process described herein.

In some embodiments, this disclosure features a semiconductor device that includes the three dimensional object described herein.

BRIEF DESCRIPTION OF THE DRAWING

FIG. 1 is a scheme illustrating a dielectric layer at the top of a substrate with copper pattern.

DETAILED DESCRIPTION OF THE DISCLOSURE

As used herein, the term "fully imidized" means the polyimide polymers of this disclosure are at least about 90% (e.g., at least about 95%, at least about 98%, at least about 99%, or about 100%) imidized. As used herein, the term "(meth)acrylates" include both acrylates and methacrylates. As used herein, a catalyst (e.g., an initiator) is a compound capable of inducing a polymerization or crosslinking reaction when exposed to heat and/or a source of radiation. As used herein, an electronic substrate is a substrate (e.g., a silicon or copper substrate) that becomes a part of a final electronic device. As used herein, the terms "film" and "layer" are used interchangeably.

Some embodiments of this disclosure describe a process of generating a planarizing polyimide based dielectric film on a substrate with conducting metal pattern. In some embodiments, the process includes depositing a dielectric film forming composition (which can include at least one fully imidized polyimide polymer and at least one solvent) onto a substrate with conducting metal pattern to form a dielectric film. In some embodiments, the process includes steps of:
  a. providing a dielectric film forming composition comprising at least one fully imidized polyimide polymer and at least one solvent; and
  b. depositing the dielectric film forming composition onto a substrate with conducting metal (e.g., copper) pattern to form a dielectric film, wherein the difference in the highest and lowest points on a top surface of the dielectric film is less than about 2 microns (e.g., less than about 1.5 microns, less than about 1 micron, or less than about 0.5 micron).

In some embodiments, the dielectric film forming composition described herein can include at least one (e.g., two, three, or four) solvent (e.g., an organic solvent). For example, the solvent of the dielectric film forming composition can contain alkylene carbonates such as ethylene carbonate, propylene carbonate, butylene carbonate, glycerine carbonate, or a combination thereof. In some embodiments, the amount of alkylene carbonate in a solvent mixture is at least about 20% (e.g., at least about 30%, at least about 40%, at least about 50%, at least about 60%, at least about 70%, at least 80%, or at least about 90%) by weight of the dielectric film forming composition. Without wishing to be bound by theory, it is believed that a carbonate solvent (e.g., ethylene carbonate, propylene carbonate, butylene carbonate or glycerine carbonate) can facilitate the formation of a dielectric film with a planarized surface (e.g., the difference in the highest and lowest points on a top surface of the dielectric film is less than about 2 microns).

In some embodiments, the amount of the solvent is at least about 40 weight % (e.g., at least about 45 weight %, at least about 50 weight %, at least about 55 weight %, at least about 60 weight %, or at least about 65 weight %) and/or at most about 98 weight % (e.g., at most about 95 weight %, at most about 90 weight %, at most about 85 weight %, at most about 80 weight %, or at most about 75 weight %) of the total weight of the dielectric film forming composition.

In some embodiments, the at least one (e.g., two, three, or four) fully imidized polyimide polymer is prepared by reaction of at least one diamine with at least one dicarboxylic acid dianhydride. In some embodiments, the resulting polymer is soluble in the solvent of this disclosure to facilitate the formation of a dielectric film with a planarized surface (e.g., the difference in the highest and lowest points on a top surface of the dielectric film is less than about 2 microns).

Examples of suitable diamines include, but are not limited to, 1-(4-aminophenyl)-1,3,3-trimethylindan-5-amine (alternative names including 4,4'-[1,4-phenylene-bis(1-methylethylidene)] bisaniline), 1-(4-aminophenyl)-1,3,3-trimethyl-2H-inden-5-amine, 1-(4-aminophenyl)-1,3,3-trimethylindan-5-amine, [1-(4-aminophenyl)-1,3,3-trimethyl-indan-5-yl]amine, 1-(4-aminophenyl)-2,3-dihydro-1,3,3-trimethyl-1H-inden-5-amine, 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, 5,7-diamino-1,1-dimethyl-4-ethylindan, p-phenylenediamine, m-phenylenediamine, o-phenylenediamine, 3-methyl-1,2-benzene-diamine, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,2-diaminocyclohexane, 1,4-diaminocyclohexane, 1,3-cyclohexanebis(methylamine), 5-amino-1,3,3-trimethyl cyclohexanemethanamine, 2,5-diaminobenzotrifluoride, 3,5-diaminobenzotrifluoride, 1,3-diamino-2,4,5,6-tetrafluorobenzene, 4,4'-oxydianiline, 3,4'-oxydianiline, 3,3'-oxydianiline, 3,3'-diaminodiphenylsulfone, 4,4'-diaminodiphenylsulfones, 4,4'-isopropylidenedianiline, 4,4'-diaminodiphenylmethane, 2,2-bis(4-aminophenyl)propane, 4,4' diaminodiphenyl propane, 4,4'-diaminodiphenyl sulfide, 4,4'-diaminodiphenylsulfone, 4-aminophenyl-3-aminobenzoate, 2,2'-dimethyl-4,4'-diaminobiphenyl, 3,3'-dimethyl-4,4'-diaminobiphenyl, 2,2'-bis (trifluoromethyl) benzidine, 3,3'-bis (trifluoromethyl) benzidine, 2,2-bis [4-(4-aminophenoxy phenyl)] hexafluoropropane, 2,2-bis (3-amino-4-methylphenyl)-hexafluoropropane, 2,2-bis(3-aminophenyl)-1,1,1,3,3,3-hexafluoropropane, 1,3-bis-(4-aminophenoxy) benzene, 1,3-bis-(3-aminophenoxy)benzene, 1,4-bis-(4-aminophenoxy)benzene, 1,4-bis-(3-aminophenoxy) benzene, 1-(4-aminophenoxy)-3-(3-aminophenoxy) benzene, 2,2'-bis-(4-phenoxyaniline)isopropylidene, bis(p-beta-amino-t-butylphenyl)ether, p-bis-2-(2-methyl-4-aminopentyl)benzene, p-bis(1,1-dimethyl-5-aminopentyl) benzene, 3,3'-dimethyl-4,4'-diaminobiphenyl, 4,4'-diaminobenzophenone, 3'-dichlorobenzidine, 2,2-bis [4-(4-aminophenoxy)phenyl] propane, 4,4'-[1,3-phenylenebis(1-methyl-ethylidene)] bisaniline, 4,4'-[1,4-phenylenebis(1-methyl-ethylidene)]bisaniline, 2,2-bis [4-(4-aminophenoxy) phenyl] sulfone, 2,2-bis [4-(3-aminophenoxy) benzene], 1,4-bis (4-aminophenoxy) benzene, 1,3-bis (4-aminophenoxy) benzene, (1,3'-bis (3-aminophenoxy) benzene, and 9H-fluorene-2,6-diamine. Any of these diamines can be used individually or in combination in any ratio as long as the resulting polyimide polymer satisfies the requirements of this disclosure.

In some embodiments, the diamines having a relatively high rigidity in structure can include a fused ring structure (e.g., a fused aromatic or non-aromatic ring structure), such as an indanyl group. In some embodiments, the diamines having a relatively low rigidity in structure does not include a fused ring structure.

Examples of suitable tetracarboxylic acid dianhydride monomers include, but are not limited to, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, 1-(3',4'-dicarboxyphenyl)-3-methylindan-6,7-dicarboxylic acid anhydride, pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo [4.4.1.0$^{2,5}$.0$^{7,10}$]undecane-1,2,3,4-tetracarboxylic acid dianhydride, 3,3',4,4'-benzophenone tetracarboxylic dianhydride, 3,3',4,4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis(3,4-dicarboxyphenyl)] hexafluoropropane dianhydride, ethyleneglycol bis(anhydrotrimellitate), and 5-(2,5-dioxotetrahydro)-3-methyl-3-cyclohexene-1,2-dicarboxylic anhydride. More preferred tetracarboxylic acid dianhydride monomers include 2,2-[bis(3, 4-dicarboxyphenyl)] hexafluoropropane dianhydride, 3,3',4,4'-benzophenone tetracarboxylic dianhydride, 3,3',4,4'-diphenylsulfone tetracarboxylic dianhydride, and 3,3',4,4'-diphenyl ether tetracarboxylic dianhydride. Any of these tetracarboxylic acid dianhydride can be used individually or in combination in any ratio as long as the resulting polyimide polymer satisfies the requirements of this disclosure.

In some embodiments, the at least one fully imidized polyimide polymer can be prepared by a monomer with a relatively high rigidity in structure and a monomer with a relatively low rigidity in structure. For example, the at least one fully imidized polyimide polymer can be prepared by reacting a dicarboxylic acid dianhydride with a first diamine with a relatively high rigidity and a second diamine with a relatively low rigidity. Without wishing to be bound by theory, it is believed that such a polyimide polymer can facilitate the formation of a dielectric film with a planarized surface (e.g., the difference in the highest and lowest points on a top surface of the dielectric film is less than about 2 microns).

In some embodiments, to synthesize the fully imidized polyimide (PI) polymer, a polyimide precursor polymer is prepared first. In some embodiments, the PI precursor polymer is a polyamic acid (PAA) polymer. In some embodiments, the PI precursor is a polyamic ester (PAE) polymer. In some embodiments, one or more diamine(s) are combined with one or more tetracarboxylic acid dianhydride(s) in at least one (e.g., two, three, or more) polymerization solvent to form a polyamic acid (PAA) polymer. In some embodiments, the PAA polymer formed is imidized, either chemically or thermally, to form a PI polymer. In some embodiments, the PAA polymer is end-capped by using an appropriate reagent during or after the polymer synthesis. In some embodiments, the PAA polymer formed is esterified to form a polyamic ester (PAE) polymer. In some embodiments, the PAE polymer is formed by combination of a tetracarboxylic half ester with one or more diamines in at least one polymerization solvent. In some embodiments, the PAE polymer is end-capped by using an appropriate agent. In some embodiments, an end-capped PI polymer is synthesized from a PAA polymer or a PAE polymer containing an end-cap group. In some embodiments, such a PI polymer is end-capped after imidization.

In some embodiments, a chemical imidizing agent (e.g., a dehydrating agent) is added to a PAA polymer to catalyze the ring-closing dehydration process of the polyamic acid groups to form imide functionalities, thereby forming a PI polymer. Examples of suitable dehydrating agents include, but are not limited to, trifluoromethanesulfonic acid, methanesulfonic acid, p-toluenesulfonic acid, ethanesulfonic acid, butanesulfonic acid, perfluorobutanesulfonic acid, acetic anhydride, propionic anhydride, and butyric anhydride. In addition, this dehydration process can be catalyzed by further addition of a basic catalyst. Examples of suitable basic catalysts include, but are not limited to, pyridine, triethylamine, tripropylamine, tributylamine, dicyclohexylmethylamine, 2,6-lutidine, 3,5-lutidine, picoline, 4-dimethylaminopyridine (DMAP) and the like.

Methods to synthesize end-capped and non-endcapped PI precursor polymers are well known to those skilled in the art. Examples of such methods are disclosed in, e.g., U.S. Pat. Nos. 2,731,447, 3,435,002, 3,856,752, 3,983,092, 4,026,876, 4,040,831, 4,579,809, 4,629,777, 4,656,116, 4,960,860, 4,985,529, 5,006,611, 5,122,436, 5,252,534, 5,478,915, U.S. Pat. Nos. 5,773,559, 5,783,656, 5,969,055, 9,617,386, and US application publication numbers US20040265731, US20040235992, and US2007083016, the contents of which are hereby incorporated by reference.

In some embodiments, the dielectric film forming composition described herein (e.g., a 20% solution of polyimide polymer in cyclopentanone) can have a kinematic viscosity of at most about 1500 centistoke (e.g., at most about 1400 centistoke, at most about 1300 centistoke, at most about 1200 centistoke, at most about 1100 centistoke, at most about 1000 centistoke, or at most about 900 centistoke) and/or at least about 100 centistoke (e.g., at least about 200 centistoke, at least about 300 centistoke, at least about 400 centistoke, at least about 500 centistoke, at least about 600 centistoke, or at least about 700 centistoke).

In some embodiments, the polyimide can be prepared from diamines excluding the siloxane diamine of Structure (II):

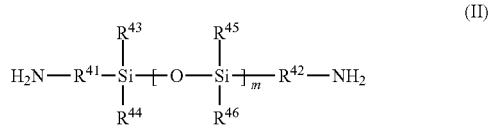

in which $R^{41}$ and $R^{42}$ are each independently a divalent aliphatic or aromatic group, $R^{43}$, $R^{44}$, $R^{45}$ and $R^{46}$ each independently is a monovalent aliphatic or aromatic group, m is an integer of 1-100.

Examples of monomer of siloxane diamines of structure (III) include, but are not limited to:

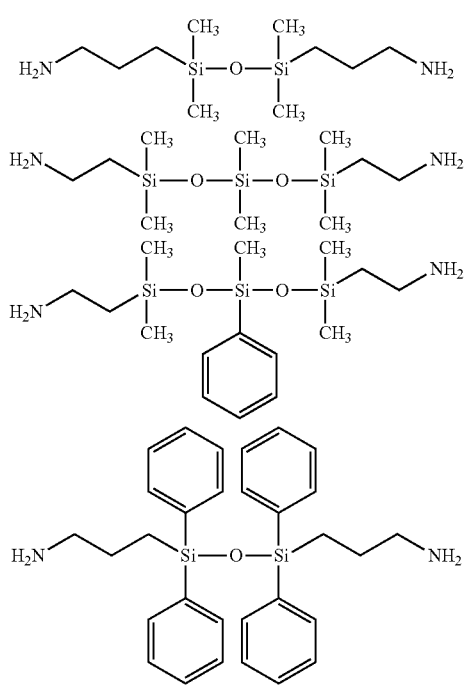

-continued

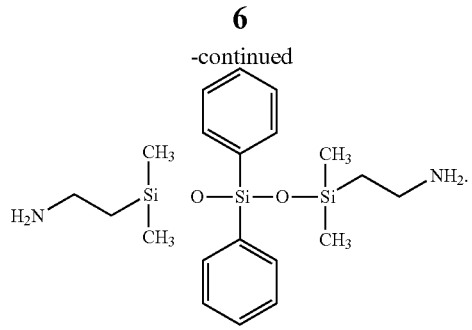

In general, the polyimide polymer thus formed can be soluble in an organic solvent (e.g., alkylene carbonate). In some embodiments, the polyimide polymer can have a solubility in an organic solvent (e.g., alkylene carbonate) of at least about 50 mg/mL (e.g., at least about 100 mg/mL or at least about 200 mg/m L) at 25° C. Examples of organic solvents that can be combined with alkylene carbonate include, but are not limited to, lactones such as gamma-butyrolactone, ε-caprolactone, γ-caprolactone and δ-valerolactone; cycloketones such as cyclopentanone and cyclohexanone; linear ketones such as methyl ethyl ketone (MEK) and methyl isobutyl ketone (MIBK); esters such as n-butyl acetate; ester alcohol such as ethyl lactate; ether alcohols such as tetrahydrofurfuryl alcohol; glycol esters such as propylene glycol methyl ether acetate; glycol ethers such as propylene glycol methyl ether (PGME); cyclic ethers such as tetrahydrofuran (THF); and pyrrolidones such as n-methyl pyrrolidone.

In some embodiments, the weight average molecular weight (Mw) of the polyimide polymer described herein is at least about 5,000 Daltons (e.g., at least about 10,000 Daltons, at least about 20,000 Daltons, at least about 25,000 Daltons, at least about 30,000 Daltons, at least about 35,000 Daltons, at least about 40,000 Daltons, or at least about 45,000 Daltons) and/or at most about 100,000 Daltons (e.g., at most about 90,000 Daltons, at most about 80,000 Daltons, at most about 70,000 Daltons, at most about 65,000 Daltons, at most about 60,000 Daltons, at most about 55,000 Daltons, or at most about 50,000 Daltons). The weight average molecular weight can be obtained by gel permeation chromatography methods and calculated using a polystyrene standard. Without wishing to be bound by theory, it is believed that including a polyimide having a molecular weight in the above-described range (e.g., from 20,000 Daltons to 100,000 Daltons) in the film forming composition described herein can facilitate the formation of a dielectric film with a planarized surface (e.g., the difference in the highest and lowest points on a top surface of the dielectric film is less than about 2 microns).

In some embodiments, the dielectric film forming composition is photosensitive.

In some embodiments, the amount of polyimide in the dielectric film forming composition is at least about 2 weight % (e.g., at least about 5 weight %, at least about 10 weight %, at least about 15 weight %, or at least about 20 weight %) and/or at most or at most about 55 weight % (e.g., at most about 50 weight %, at most about 45 weight %, at most about 40 weight %, at most about 35 weight %, at most about 30 weight %, or at most about 25 weight %) of the total weight of the dielectric film forming composition.

In some embodiments, the dielectric film forming composition of this disclosure can optionally further include at least one (e.g., two, three, or four) crosslinker. In some embodiments, the crosslinker contains two or more alkenyl or alkynyl groups. In general, the crosslinker can be capable of undergoing a crosslinking or polymerization reaction in the presence of a catalyst.

In some embodiments, the at least one crosslinker is at least one urethane acrylate oligomer. The term "urethane acrylate oligomer" refers to a class of urethane (meth) acrylate compounds that contain urethane linkages and have (meth)acrylate (e.g., acrylate or methacrylate) functional groups such as urethane multi(meth)acrylate, multiurethane (meth)acrylate, and multiurethane multi(meth)acrylate. Types of urethane (meth)acrylate oligomers have been described by, for example, Coady et al., U.S. Pat. No. 4,608,409 and by Chisholm et al., U.S. Pat. No. 6,844,950, the contents of which are hereby incorporated by reference. Specific examples of urethane acrylate oligomers useful in the present disclosure include, but are not limited to, CN9165US, CN9167US, CN972, CN9782, CN9783 and CN992. These and other urethane acrylate oligomers are commercially available from Arkema (Sartomer).

In some embodiments, the crosslinker contains at least two (meth)acrylate groups. In some embodiments, the crosslinker is selected from the group consisting of 1,6-hexanediol di(meth)acrylate, tetraethyleneglycol di(meth)acrylate, 1,12-dodecanediol di(meth)acrylate, 1,3-butylene glycol di(meth)acrylate, 1,4-butanediol di(meth)acrylate, cyclohexane dimethanol di(meth)acrylate, polyethylene glycol di(meth)acrylate, propoxylated (3) glycerol tri(meth)acrylate, divinylbenzene, ethoxylated bisphenol-A-di(meth) acrylate, diethylene glycol bis(allyl carbonate), trimethylolpropane tri(meth)acrylate, ditrimethylolpropane tetra(meth) acrylate, pentaerythritol tri(meth)acrylate, pentaerythritol tetra(meth)acrylate, dipentaerythritol penta-/hexa-(meth) acrylate, isocyanurate tri(meth)acrylate, bis(2-hydroxyethyl)-isocyanurate di(meth)acrylate, 1,3-butanediol tri (meth)acrylate, 1,4-butanediol tri(meth)acrylate, neopentyl glycol di(meth)acrylate, (meth)acrylate modified-urea-formaldehyde resins, (meth)acrylate modified melamine-formaldehyde resins and (meth)acrylate modified cellulose.

In some embodiments, the dielectric film forming composition described herein can optionally contain a metal-containing (meth)acrylates (MCAs) as cross-linkers. MCAs useful in the present disclosure generally have sufficient compatibility with other ingredients in the dielectric film forming composition and are readily dispersed or dissolved in the composition upon mixing. The MCAs can be incorporated into the dielectric film forming composition as a solid or as a solution. In general, the MCA-containing compositions do not phase separate (i.e., become visibly heterogeneous) upon standing over the course of at least 24 hours at 25° C. In addition, films formed from the MCA-containing compositions are typically visibly clear and homogenous.

Suitable metal atoms useful for the MCAs in the present disclosure include titanium, zirconium, hafnium, and germanium. In some embodiments, the MCAs include at least one metal atom and at least one (e.g., one, two, three, or four) (meth)acrylate group. Preferred MCAs contain three or four (meth)acrylate groups attached to each metal atom. Examples of suitable MCAs include, but are not limited to, titanium tetra(meth)acrylate, zirconium tetra(meth)acrylate, hafnium tetra(meth)acrylate, titanium butoxide tri(meth) acrylate, titanium dibutoxide di(meth)acrylate, titanium tributoxide (meth)acrylate, zirconium butoxide tri(meth) acrylate, zirconium dibutoxide di(meth)acrylate, zirconium tributoxide (meth)acrylate, hafnium butoxide tri(meth)acrylate, hafnium dibutoxide di(meth)acrylate, hafnium tributoxide (meth)acrylate, titanium tetra(carboxyethyl (meth) acrylate), zirconium tetra(carboxyethyl (meth)acrylate), hafnium tetra(carboxyethyl (meth)acrylate), titanium butoxide tri(carboxyethyl (meth)acrylate), titanium dibutoxide di(carboxyethyl (meth)acrylate), titanium tributoxide (carboxyethyl (meth)acrylate), zirconium butoxide tri(carboxyethyl (meth)acrylate), zirconium dibutoxide di(carboxyethyl (meth)acrylate), zirconium tributoxide (carboxyethyl (meth) acrylate), hafnium butoxide tri(carboxyethyl (meth)acrylate), hafnium dibutoxide di(carboxyethyl (meth)acrylate), and hafnium tributoxide (carboxyethyl (meth)acrylate). In general, the (meth)acrylate groups of the MCAs are sufficiently reactive to enable the MCAs to participate in crosslinking or polymerization of the MCA-containing film induced by free radicals, which may be generated by one or more catalysts present in the dielectric polyimide film forming composition. The crosslinking or polymerization can occur among at least two MCAs or among at least one MCA and at least one non-MCA crosslinker in the dielectric film forming composition. In some embodiments, an MCA is a crosslinker (e.g., when the MCA includes two or more (meth)acrylate groups). In some embodiments, an MCA is a monomer suitable for polymerization or function as a chain terminator (e.g., when the MCA includes only one (meth) acrylate group).

In some embodiments, the amount of the cross-linker is at least about 1 weight % (e.g., at least about 2 weight %, at least about 4 weight %, at least about 8 weight %, at least about 12 weight %, or at least about 16 weight %) and/or at most about 50 weight % (e.g., at most about 45 weight %, at most about 40 weight %, at most about 35 weight %, at most about 30 weight %, or at most about 20 weight %) of the total weight of the dielectric film forming composition.

In some embodiments, the dielectric film forming composition described herein can optionally contain at least one (e.g., two, three, or four) reactive diluent. In some embodiments, reactive diluent contains one (meth)acrylate group. Examples of suitable reactive diluent include, but are not limited to, ethylene glycol dicyclopentenyl ether acrylate, isobornyl methacrylate, ethoxylated o-phenylphenol acrylate, phenoxypolyethyleneglycol acrylate, isostearyl Acrylate, methoxy polyethylene glycol 400 Acrylate, ethylene glycol methyl ether acrylate, 2-(dimethylamino)ethyl acrylate, 3,5,5-trimethylhexyl acrylate, 3-(trimethoxysilyl)propyl acrylate, 2-tetrahydropyranyl acrylate, tetrahydrofurfuryl acrylate, and methyl 2-(chloromethyl)acrylate. In some embodiments, the reactive diluent does not include a metal ion.

In some embodiments, the amount of the reactive diluent in the dielectric film forming composition is at least about 0.5 weight % (e.g., at least about 1 weight %, at least about 2 weight %, at least about 4 weight %, at least about 6 weight %, or at least about 8 weight %) and/or at most about 20 weight % (e.g., at most about 18 weight %, at most about 16 weight %, at most about 14 weight %, at most about 12 weight %, or at most about 10 weight %) of the total weight of the dielectric film forming composition.

In some embodiments, the dielectric film forming composition of this disclosure can include at least one (e.g., two, three, or four) catalyst (e.g., an initiator). The catalyst is capable of inducing crosslinking or polymerization reaction when exposed to heat and/or a source of radiation.

In some embodiments, the catalyst used is a photoinitiator, where the photoinitiator is a compound capable of generating free radicals when exposed to high energy radiation. Non-limiting examples of high energy radiation include electron beams, ultraviolet light, and X-ray. Without wishing to be bound by theory, it is believed that the photoinitiator induces a crosslinking or polymerization reaction involving the cross-linker (e.g., the (meth)acrylate groups of the MCA compound) and/or other entities present in the composition that are capable of undergoing crosslinking or polymerization reaction. Examples of such entities include polyimides bearing alkenyl and alkynyl functional groups and reactive diluents containing (meth)acylate groups.

Specific examples of photoinitiators include, but are not limited to, 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis(2,4,6-trimethyl benzoyl)phenyl phosphine oxide (Irgacure 819 from BASF), 2-methyl-1-[4-(methylthio)phenyl]-2-morphorinopropane-1-on (Irgacure 907 from BASF), (2,4,6-trimethylbenzoyl)diphenyl phosphine oxide (Lucerin TPO from BASF), 2-(Benzoyloxyimino)-1-[4-(phenylthio)phenyl]-1-octanone (Irgacure OXE-01 from BASF), 1-[9-Ethyl-6-(2-methylbenzoyl)-9H-carbazol-3-yl]ethanone 1-(0-acetyloxime) (Irgacure OXE-2 from BASF), ethoxy(2,4,6-trimethylbenzoyl)phenyl phosphine oxide (Lucerin TPO-L from BASF), a blend of phosphine oxide, hydroxy ketone and a benzophenone derivative (ESACURE KTO46 from Arkema), 2-hydroxy-2-methyl-1-phenylpropane-1-on (Darocur 1173 from Merck), NCI-831 (ADEKA Corp.), NCI-930 (ADEKA Corp.), N-1919 (ADEKA Corp.), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators include (5-toluylsulfonyloxyimino-5H-thiophen-2-ylidene)-2-methylphenyl-acetonitrile (Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl)diazomethane, 1-p-toluenesulfonyl-1-cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

In some embodiments, a photosensitizer can be used in the dielectric film forming composition where the photosensitizer can absorb light in the wavelength range of 193 to 405 nm. Examples of photosensitizers include, but are not limited to, 9-methylanthracene, anthracenemethanol, acenaphthylene, thioxanthone, methyl-2-naphthyl ketone, 4-acetylbiphenyl, and 1,2-benzofluorene.

In embodiments where the crosslinking or polymerization reaction is initiated by heat, the catalyst used is a thermal initiator where the thermal initiator is a compound capable of generating free radicals when exposed to a temperature from about 70° C. to about 250° C. Without wishing to be bound by theory, it is believed that the thermal initiator induces a crosslinking or polymerization reaction involving, e.g., a crosslinker and polyimides bearing alkenyl and alkynyl functional groups.

Specific examples of thermal initiators include, but are not limited to, benzoyl peroxide, cyclohexanone peroxide, lauroyl peroxide, tert-amyl peroxybenzoate, tert-butyl hydroperoxide, di(tert-butyl)peroxide, dicumyl peroxide, cumene hydroperoxide, succinic acid peroxide, di(n-propyl) peroxydicarbonate, 2,2-azobis(isobutyronitrile), 2,2-azobis(2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

In some embodiments, a combination of two or more catalysts can be used in the dielectric film forming composition. The combination of catalysts can be all thermal initiators, all photoinitiators, or a combination of at least one thermal initiator and at least one photoinitiator.

In some embodiments, the amount of the catalyst is at least about 0.2 weight % (e.g., at least about 0.5 weight %, at least about 0.8 weight %, at least about 1.0 weight %, or at least about 1.5 weight %) and/or at most about 3.0 weight % (e.g., at most about 2.8 weight %, at most about 2.6 weight %, at most about 2.3 weight %, or at most about 2.0 weight %) of the total weight of the dielectric film forming composition.

In some embodiments, the dielectric film forming composition of this disclosure may optionally contain at least one (e.g., two, three, or four) inorganic filler (inorganic particle). Suitable fillers are describe in U.S. Patent Application No. 2019/0077913, the contents of which are hereby incorporated by reference.

In some embodiments, the amount of the inorganic filler (e.g., silica filler) is at least about 1 weight % (e.g., at least about 2 weight %, at least about 5 weight %, at least about 8 weight %, or at least about 10 weight %) and/or at most about 30 weight % (e.g., at most about 25 weight %, at most about 20 weight %, or at most about 15 weight %) of the total weight of the dielectric film forming composition.

In some embodiments, the dielectric film forming composition of this disclosure further includes one or more (e.g., two, three, or four) adhesion promoter. Suitable adhesion promoters are described in "Silane Coupling Agent" Edwin P. Plueddemann, 1982 Plenum Press, New York. Classes of adhesion promoters include, but are not limited to, mercaptoalkoxysilanes, aminoalkoxysilanes, epoxyalkoxysilanes, glycidyloxyalkoxysilanes, mercaptosilanes, cyanatosilanes and imidazole silanes. In some embodiments, the adhesion promoter contains both an alkoxysilyl group and a functional group containing carbon-carbon multiple bond selected from substituted or unsubstituted alkenyl groups and substituted or unsubstituted alkynyl groups.

In some embodiments, the dielectric film forming composition of the present disclosure can specifically exclude one or more of the following adhesion promoters, in any combination, if more than one. Such adhesion promoters can be selected from the group consisting of primary amine containing adhesion promoters (such as 3-aminopropyl triethoxysilane and m-aminophenyl triethoxysilane), secondary amine containing adhesion promoters (such as N-cyclohexylamino trimethoxysilane), tertiary amine containing adhesion promoters (such as diethylaminoethyl triethoxysilane), urea containing adhesion promoters (such as ureidopropyl trimethoxysilane), anhydride containing adhesion promoters (such as 3-(triethoxysilyl)propyl succinic anhydride), epoxy containing adhesion promoters (such as 2-(3, 4-epoxycyclohexyl)ethyl triethoxysilane), isocyanato containing adhesion promoters (such as 3-isocyanatopropyltriethoxy silane), and sulfur containing adhesion promoters (such as 3-mercaptopropyl trimethoxysilane).

In some embodiments, the amount of the optional adhesion promoter is at least about 0.5 weight % (e.g., at least about 0.8 weight %, at least about 1 weight %, or at least about 1.5 weight %) and/or at most about 4 weight % (e.g., at most about 3.5 weight %, at most about 3 weight %, at most about 2.5 weight %, or at most about 2 weight %) of the total weight of the dielectric film forming composition.

The dielectric film forming composition of this disclosure can also optionally contain one or more (e.g., two, three, or four) surfactant. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

In some embodiments, the amount of the surfactant is at least about 0.005 weight % (e.g., at least about 0.01 weight % or at least about 0.1 weight %) and/or at most about 1 weight % (e.g., at most about 0.5 weight % or at most about 0.2 weight %) of the total weight of the dielectric film forming composition.

The dielectric film forming composition of the present disclosure can optionally contain one or more (e.g., two, three, or four) plasticizers.

The dielectric film forming composition of the present disclosure can optionally contain one or more (e.g., two, three, or four) copper passivation reagent. Examples of copper passivation reagents include triazole compounds, imidazole compounds and tetrazole compounds. Triazole compounds can include triazole, benzotriazole, substituted triazole, and substituted benzotriazole. Examples of triazole compounds include, but are not limited to, 1,2,4-triazole, 1,2,3-triazole, or triazoles substituted with substituents such as C1-C8 alkyl (e.g., 5-methyltriazole), amino, thiol, mercapto, imino, carboxy and nitro groups. Specific examples include benzotriazole, tolyltriazole, 5-methyl-1,2,4-triazole, 5-phenyl-benzotriazole, 5-nitro-benzotriazole, 3-amino-5-mercapto-1,2,4-triazole, 1-amino-1,2,4-triazole, hydroxy-benzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like. Examples of imidazole include, but are not limited to, 2-alkyl-4-methyl imidazole, 2-phenyl-4-alkyl imidazole, 2-methyl-4(5)-nitro-imidazole, 5-methyl-4-nitroimidazole, 4-Imidazolemethanol hydrochloride, and 2-mercapto-1-methylimidazole. Examples of tetrazole include 1-H-tetrazole, 5-methyl-1H-tetrazole, 5-phenyl-1H-tetrazole, 5-amino-1H-tetrazole, 1-phenyl-5-mercapto-1H-tetrazole, 5,5'-bis-1H-tetrazole, 1-methyl-5-ethyltetrazole, 1-methyl-5-mercaptotetrazole, 1-carboxymethyl-5-mercaptotetrazole, and the like. The amount of the optional copper passivation agent, if employed, is at least about 0.1 weight % (e.g., at least about 0.2 weight % or at least about 0.5 weight %) and/or at most about 3.0 weight % (e.g., at most about 2.0 weight % or at most about 1.0 weight %) of the entire weight of the dielectric film forming composition of this disclosure.

In some embodiments, the dielectric film forming composition of this disclosure can optionally contain one or more (e.g., two, three, or four) dyes and/or one or more colorants.

In some embodiments, the dielectric film forming composition of the present disclosure may specifically exclude one or more of additive components, in any combination, if more than one. Such components can be selected from the group consisting of non-polyimide polymers, non-crosslinking non-polyimide polymers, surfactants (e.g., cationic surfactants, anionic surfactants, or non-ionic surfactants), plasticizers, colorants, dyes, water, pH adjusting agents, oxygen scavengers, quaternary ammonium compounds (e.g., salts or hydroxides), amines, alkali metal and alkaline earth bases (such as NaOH, KOH, LiOH, magnesium hydroxide, and calcium hydroxide), fluoride containing compounds (e.g., monomeric or polymeric compounds), oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, corrosion inhibitors (e.g., non-azole corrosion inhibitors), guanidine, guanidine salts, inorganic acids (e.g., sulfonic acids, sulfuric acid, sulfurous acid, nitrous acid, nitric acid, phosphorous acid, and phosphoric acid), organic acids (e.g., hydroxycarboxylic acids, and carboxylic and polycarboxylic acids), pyrrolidone, polyvinyl pyrrolidone, and metal salts (e.g., metal halides).

In some embodiments, a substrate with conducting metal pattern can be coated with the dielectric film forming composition described above to form a dielectric film in which the difference in the highest and lowest points on a top surface of the film is less than about 2 microns.

In some embodiments, the coating of the substrate with conducting metal pattern can be done by any suitable method, including, but not limited to, spin coating, slit coating, spray coating, dip coating and ink-jetting. One skilled in the art will know which coating method is appropriate for a given application.

In some embodiment, the coating of substrate with conducting metal pattern can be heat treated at a temperature of at most about 230° C. (e.g., at most about 210° C., at most about 190° C., at most about 170° C., or at most about 150° C.).

In some embodiments, the amount of alkylene carbonates after patterning and heat treatment of the dielectric film is at most about 5 wt % (e.g., at most about 4 wt %, at most about 3 wt %, at most about 2 wt %, or at most about 1 wt %) of the dielectric film.

In some embodiments, a three dimensional object can be prepared by a process described above. In some embodiments, a semiconductor device can be produced by using these three dimensional objects. Examples of such objects include a semiconductor substrate, a flexible film for electronics, a wire isolation, a wire coating, a wire enamel, or an inked substrate. In some embodiments, the semiconductor device is an integrated circuit, a light emitting diode, a solar cell, or a transistor

EXAMPLES

General Description of Coating a Test Substrate by Spin Coating

The test substrate for Example 1 and Comparative Example 1 was prepared by using a 4 inch silicon wafer with copper peaks with 100 micron space between them. The thickness of copper peaks was 3.5 microns. The dielectric film forming composition was deposited by spin coating on the test substrate to form a dielectric film, which was soft-baked at 90° C. for 3 minutes, exposed through a mask using an i-line stepper (Cannon i4), developed in cyclopentanone (2×70 seconds), rinsed with propylene glycol monomethyl ether acetate (PGMEA), and cured at 170° C. for 2 hours in an oven with nitrogen atmosphere.

The difference between the highest and lowest points on a top surface of the polyimide based dielectric film was measured at three stages, once after coating, once after development, and once after cure by DEKTAK XT.

Example 1

A photosensitive composition FE-1 was prepared by using 100 parts of a 30.93% solution of a polyimide polymer (P-1) having the structure shown below and a weight average molecular weight of 54,000 in cyclopentanone, 51.9 parts of propylene carbonate, 1.9 parts of a 0.5 wt % solution of PolyFox 6320 (available from OMNOVA Solutions) in propylene carbonate, 1.45 parts of gamma-glycidoxypropyltrimethoxysilane, 0.9 parts of 2-(O-Benzoyloxime)-1-[4-(phenylthio)phenyl]-1,2-octanedione (Irgacure OXE-1 from BASF), 0.03 parts of t-butylcatechol, 11.6 parts of tetraethylene glycol diacrylate, 3.9 parts of pentaerythritol triacrylate and 0.15 parts of 5-methyl benzotriazole. After being stirred mechanically for 24 hours, the solution was filtered by using a 0.2 micron filter (Ultradyne from Meissner Corporation, cat #CLTM0.2-552). This dielectric film forming composition was then tested according to general procedure described above and the results are shown in Table 1.

TABLE 1

| Difference in the highest and lowest points on top surface of the polyimide based dielectric film | | |
|---|---|---|
| After softbake (μm) | After development (μm) | After curing (μm) |
| 1.23 | 0.76 | 0.5 |

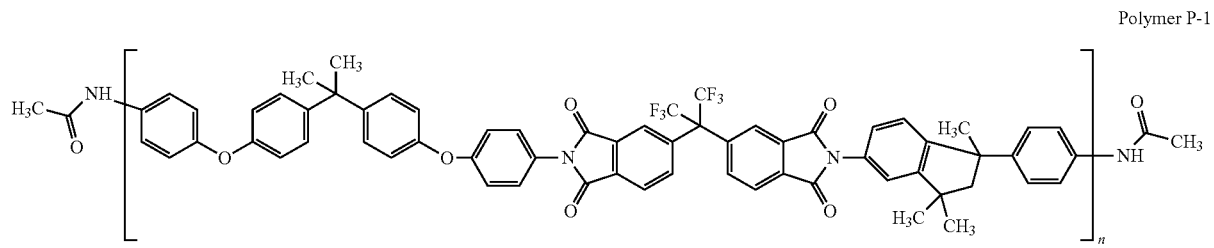

Polymer P-1

Comparative Example 1

A photosensitive composition CFE-1 was prepared by using 100 parts of a 31.76% solution of polyimide polymer (P-II) having the structure shown below and a weight average molecular weight of 74,000 in cyclopentanone, 33.2 parts of cyclopentanone, 9.4 parts of GBL, 1.9 parts of a 0.5 wt % solution of PolyFox 6320 (available from OMNOVA Solutions) in GBL, 1.6 parts of gamma-glycidoxypropyltrimethoxysilane, 0.95 parts of 2-(O-Benzoyloxime)-1-[4-(phenylthio)phenyl]-1,2-octanedione (Irgacure OXE-1 from BASF), 0.06 parts of p-benzoquinone, 13.1 parts of tetraethylene glycol diacrylate, and 4.4 parts of pentaerythritol triacrylate. After being stirred mechanically for 24 hours, the solution was filtered by using a 0.2 micron filter (Ultradyne from Meissner Corporation, cat #CLTM0.2-552). This dielectric film forming composition was then tested according to general procedure described above and the results are shown in Table 2.

TABLE 2

| Difference in the highest and lowest points on a top surface of the polyimide based dielectric film | | |
|---|---|---|
| After softbake (μm) | After development (μm) | After curing (μm) |
| 2.37 | 2.25 | 2.44 |

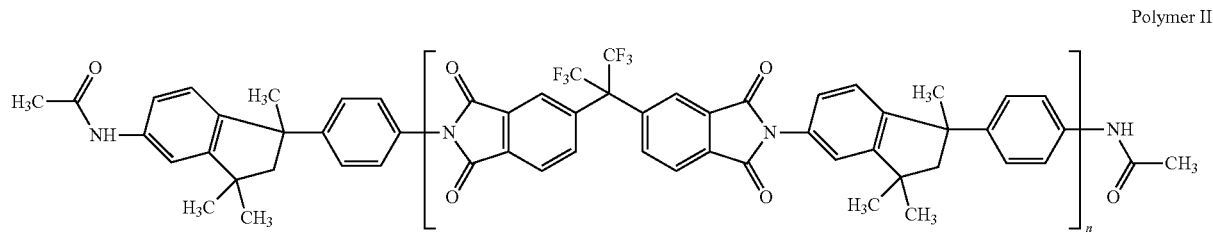

Polymer II

As shown in Tables 1 and 2, composition FE-1 surprisingly formed a film with a significantly smoother surface than the film formed by composition CFE-1.

General Description of Coating a Test Substrate by Spray Method

The test substrate for Example 2 was prepared by using an eight inch silicon oxide wafer with copper peaks with L/S test patterns of 8/8 microns, 10/10 microns and 15/15 microns. Average copper line height was 5.1 microns with a range of 1.6 microns across the wafer. The dielectric film forming composition was deposited by spray coating using the Ultrasonic Systems, Inc. Prism 800 spray coater on the test substrate to form a dielectric film with a film thickness of about 13 microns, which was soft-baked at 95° C. for 6 minutes.

The difference between the highest and lowest points on a top surface of the polyimide based dielectric film was measured after coating by DEKTAK XT.

Example 2 (Spray Coating)

A photosensitive composition FE-2 was prepared by using 100 parts of a 32.87% solution of a polyimide polymer (P-1) having a weight average molecular weight of 63,300 in a solution containing 90% cyclopentanone and 10% propylene carbonate, 100.4 parts of propylene carbonate, 126 parts of cyclopentanone, 1.97 parts of a 0.5 wt % solution of PolyFox 6320 (available from OMNOVA Solutions) in propylene carbonate, 1.64 parts of 3-(trimethoxysilyl)propyl methacrylate, 0.99 parts of 2-(O-benzoyloxime)-1-[4-(phenylthio)phenyl]-1,2-octanedione (Irgacure OXE-1 from BASF), 0.07 parts of monomethyl ether hydroquinone, 13.3 parts of tetraethylene glycol diacrylate, 4.1 parts of pentaerythritol triacrylate, and 0.16 parts of 5-methyl benzotriazole. After being stirred mechanically for 24 hours, the solution was filtered by using a 0.2 micron filter (Ultradyne from Meissner Corporation, cat #CLTM0.2-552). This dielectric film forming composition was then tested according to general procedure described above and the results are shown in Table 3.

TABLE 3

Table 3: Film Thickness across wafer for Example 2

| Mean FT (μm) | Range (μm) | Max FT (μm) | Min FT (μm) |
|---|---|---|---|
| 14.4 | 1.9 | 15.3 | 13.5 |

As shown in Table 3, composition FE-2 surprisingly formed a film with difference in the highest and lowest points less than 2 microns.

What is claimed is:

1. A process of generating a polyimide based dielectric film on a substrate with conducting metal pattern, comprising:
    providing a dielectric film forming composition comprising at least one fully imidized polyimide polymer, at least one cross-linker, and at least one solvent, wherein the at least one cross-linker contains a metal-containing (meth)acrylate; and
    depositing the dielectric film forming composition onto a substrate with conducting metal pattern to form a dielectric film, wherein the difference in the highest and lowest points on a top surface of the dielectric film is less than about 2 microns.

2. The process of claim 1 wherein the conducting metal is copper.

3. The process of claim 1, wherein the at least one solvent comprises ethylene carbonate, propylene carbonate, butylene carbonate or glycerine carbonate.

4. The process of claim 1, wherein the dielectric film forming composition is photosensitive.

5. The process of claim 1, wherein the at least one cross-linker contains two or more alkenyl or alkynyl groups.

6. The process of claim 1, wherein the at least one cross-linker contains at least two (meth)acrylate groups.

7. The process of claim 1, wherein the dielectric film forming composition further comprises at least one reactive diluent containing one (meth)acrylate group.

8. The process of claim 1, wherein the dielectric film forming composition further comprises at least one catalyst.

9. The process of claim 1, wherein the dielectric film forming composition further comprises at least one surfactant.

10. The process of claim 1, wherein the dielectric film forming composition further comprises at least one plasticizer.

11. The process of claim 1, wherein the dielectric film forming composition further comprises at least one corrosion inhibitor.

12. A three dimensional object prepared by the process of claim 1.

13. A semiconductor device, comprising the three dimensional object of claim 12.

14. The semiconductor device of claim 13, wherein the semiconductor device is an integrated circuit, a light emitting diode, a solar cell, or a transistor.

* * * * *